(12) United States Patent
Herbert

(10) Patent No.: US 6,966,357 B1
(45) Date of Patent: Nov. 22, 2005

(54) VENTURI FAN

(76) Inventor: Edward Herbert, 1 Dyer Cemetery Rd., Canton, CT (US) 06019-2029

( * ) Notice: Subject to any disclaimer, the term of this patent is extended or adjusted under 35 U.S.C. 154(b) by 0 days.

(21) Appl. No.: 10/710,815

(22) Filed: Aug. 4, 2004

Related U.S. Application Data

(60) Provisional application No. 60/481,179, filed on Aug. 5, 2003.

(51) Int. Cl.[7] .................................................. F28F 7/00
(52) U.S. Cl. ...................... 165/80.3; 165/121; 361/697; 361/703; 257/706
(58) Field of Search .................................. 165/80.3, 122, 165/121, 185; 361/697, 703; 257/706, 722

(56) References Cited

U.S. PATENT DOCUMENTS

| | | | |
|---|---|---|---|
| 5,445,215 A * | 8/1995 | Herbert | 165/80.3 |
| 5,927,944 A * | 7/1999 | Belady | 415/220 |
| 6,125,920 A * | 10/2000 | Herbert | 165/80.3 |
| 6,213,195 B1 * | 4/2001 | Downing et al. | 165/80.4 |
| 6,227,286 B1 * | 5/2001 | Katsui | 165/80.3 |
| 6,244,331 B1 * | 6/2001 | Budelman | 165/80.3 |
| 6,457,955 B1 * | 10/2002 | Cheng | 417/423.8 |
| 6,517,315 B2 * | 2/2003 | Belady | 415/221 |
| 6,575,231 B1 * | 6/2003 | Wu | 165/121 |
| 6,698,505 B2 * | 3/2004 | Lopatinsky et al. | 165/122 |
| 6,702,545 B2 * | 3/2004 | Scholten | 415/1 |

* cited by examiner

Primary Examiner—Terrell Mckinnon

(57) ABSTRACT

The "venturi fan" comprises a series of "half-venturi" shaped profiles incorporated into the periphery of a cylindrical fan, for use with a cylindrical heat sink. In one embodiment, the half-venturis are open, in another the half-venturis are enclosed so that the outer surface of the fan is smooth so that it is not a hazard to intruding fingers and the like. A leading edge deflector keeps hot compressed air in front of the venturi out of the heat sink fins.

9 Claims, 4 Drawing Sheets

VENTURI FAN

CROSS REFERENCE TO RELATED APPLICATIONS

This application is a provisional application of a provisional patent Ser. No. 60/481,179 of the same name, filed Aug. 5, 2003. Priority to that date is claimed.

BACKGROUND OF INVENTION

U.S. Pat. Nos. 5,297,617 and 5,445,215, both entitled FAN WITH HEAT SINK, and owned by the same entity as this patent application, teach that the area surrounding the fan blade tips in an axial flow fan has high velocity, very turbulent air, and that the periphery of an axial flow fan is an excellent heat sink, particularly if the inside of the fan duct and/or the fan blade are modified as taught therein to enhance the heat sinking. These are modified axial flow fans, and the air flow through them may be partly or completely redirected to fins or other features in the periphery of the fan duct, to remove heat therefrom. These patents are incorporated herein by reference.

Other related patent applications are: a provisional patent application entitled FAN WITH HEAT SINK USING STAMPED HEAT SINK FINS, Ser. No. 60/062,171, filed 16 Oct., 1997; a utility patent application of the same name, Ser. No. 09/174,374, filed 15 Oct., 1998 and issued as U.S. Pat. No. 6,125,920 on 3 Oct., 2000; a utility patent application of the same name, Ser. No. 09/678,424 filed 2 Oct., 2000; a utility patent application of the same name, Ser. No. 10/064,071 filed 6 Jun., 2002, a utility patent application entitled FAN WITH HEAT SINK, Ser. No. 10/064,060 filed 5 Jun., 2002, and a patent application Ser. No. 10/710,794 entitled WAVE-FANS AND WAVE-FANS WITH HEAT SINKS filed 3 Aug., 2004.

It is well known that a plurality of closely spaced fins makes an excellent heat sink. However, there is a boundary layer that is a very persistent viscous layer of air on the surfaces of the heat sink fins, requiring very high velocity and turbulent air flow to dissipate the boundary layer for heat flow into the air. In prior art heat sinks, this required very large, powerful and noisy fans.

In the patent applications referenced above, air is not blown through the fins, as in going in one surface and out another, but rather, air is agitated between the fins on a single surface with no separate exit air path. The air in the vicinity of a plurality of fan blades is very turbulent and has a oscillating component as each of the fan blades passes any point on fins. Air is thus scrubbed in and out of the fins with very high local velocities to break up the boundary layer and transfer heat to the air. These fins can be on an inner surface, with internal fan blades, or on an external surface with external fan blades or both, or on a circular array of buttresses or posts rising from a plate. In the latter, there may be some air flow through the fins as well, but this is incidental. High velocity and turbulent air is needed to break up the boundary layer, but a modest movement of air is sufficient to transport the heat away. The rotation of the fan blades causes enough incidental air motion around the fan with heat sink to accomplish this. Thus a fan of low or moderate power can cause more vigorous local air movement immediately on the heat sink fins if the fan blades are very close than even a very powerful fan that is spaced apart. The fans and heat sinks of these inventions are smaller, lighter, much quieter and consume much less power than prior art fans and heat sinks of the same heat capacity.

A wave-fan comprises a wavy surface, generally sinusoidal in the direction of rotation, which rotates in close proximity to the fins of a heat sink.

The heat sink fins may comprise a flat coil spring like strip of metal, similar to the familiar "Slinky" toy, placed in or on a cylinder of metal, or it may be like a closely pitched "clock spring" bonded onto a plate. Alternatively, the heat sink fins may comprise a stack of stamped metal rings pressed on or in a cylinder of metal. Alternatively, the heat sink fins may comprise a formed strip of metal that has been wrapped around a metal cylinder or attached to a flat plate. These may rest on the surface or may be pressed into complementary grooves in the surface.

SUMMARY OF INVENTION

The fans of this invention do not comprise a plurality of blades, or airfoils, as in a conventional fan. The "venturi fan" comprises a series of "half-venturi" shaped profiles incorporated into the periphery of a cylindrical fan, for use with a cylindrical heat sink. In one embodiment, the half-venturis are open, in another the half-venturis are enclosed so that the outer surface of the fan is smooth so that it is not a hazard to intruding fingers and the like. A similar arrangement is adapted for flat fans and flat heat sinks.

This arrangement has a number of benefits, among them a compact, low profile design, high efficiency, low noise and less susceptibility to dirt in the air. In some embodiments of the invention, the outer exposed surface is smooth, so they may be used in exposed locations without guards or housings. In the preferred embodiments of the invention, the centrifugal force on the air flowing through the fan is such that any contaminants tend to be thrown away from the heat sink, to greatly reduce the tendency of dust and so forth to clog the heat sink and reduce or eliminate the need for inlet air filters. Because the net air flow through the fan is much lower than in prior art fans, operation is very quiet and they requires less power.

DETAILED DESCRIPTION

Figure 1:
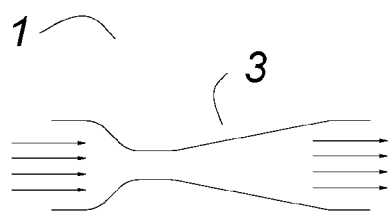
FIG. 1 shows a venturi.

FIG. 1 shows a section of a venturi 1 having a venturi wall 3. Airflow, shown by arrows, may pass through the venturi. If it does, the well known Bernoulli effect teaches that the airflow must accelerate in narrow section of the venturi 1, resulting in a pressure drop. Boyle's law teaches that if the pressure drops, the temperature drops, and this is known to apply to venturis, as they feel cold and icing is a common problem in carburetors (particularly in aircraft engines).

The venturi is often round, but the same principles apply if it has a rectangular profile, and that is the configuration used in the venturi fans, as further explained and illustrated below.

Figure 2:
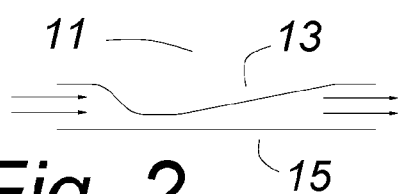
FIG. 2 shows a half venturi.

FIG. 2 shows that a venturi 11 having a venturi wall 13 can be divided along its axis of symmetry, the axis of symmetry being replaced by a dividing wall 15. For half the airflow, all characteristics are otherwise the same.

Figure 3:
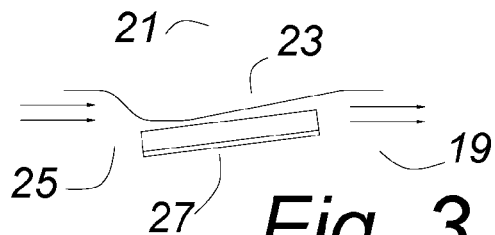
FIG. 3 shows a half venturi with a heat sink.

FIG. 3 shows a half-venturi 21 having a venturi wall 23. With reference to FIG. 2, the dividing wall 15 is replaced by a leading section 25 and a trailing section 19. In between a heat sink 27 has been introduced into the airflow. The left end of the heat sink 27 is closed, else it would suck in air due to the reduced pressure in the venturi.

Assuming the airflow is propelled by an external air pump source, not shown, at the inlet side of the venturi, the venturi represents a restriction to the airflow, and there is a higher pressure on the inlet side. By Boyle's law, if air is compressed, it is hotter. However within the throat of the venturi, the air is greatly accelerated, and by Bernoulli's principle, the pressure will drop. Boyle's law teaches that air at a reduced pressure is cooler. Therefor the heat sink 27 is placed in the region of accelerated air. As the air expands, the pressure will return to ambient pressure and the temperature will recover. This takes place above and beyond the heat sink 27.

Figure 4:
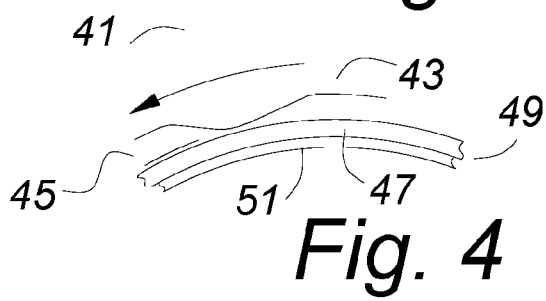
FIG. 4 shows a half venturi with a cylindrical heat sink.
Figure 5:
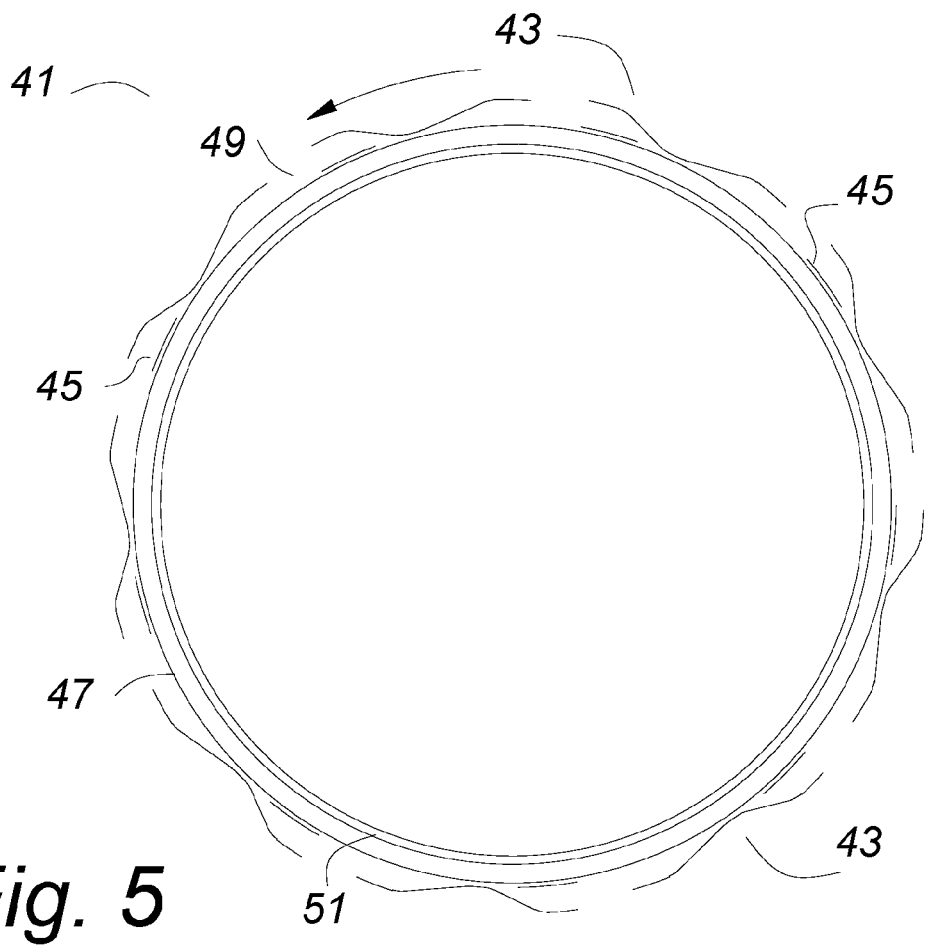
FIG. 5 shows a venturi fan rotating about a cylindrical heat sink.
Figure 6:
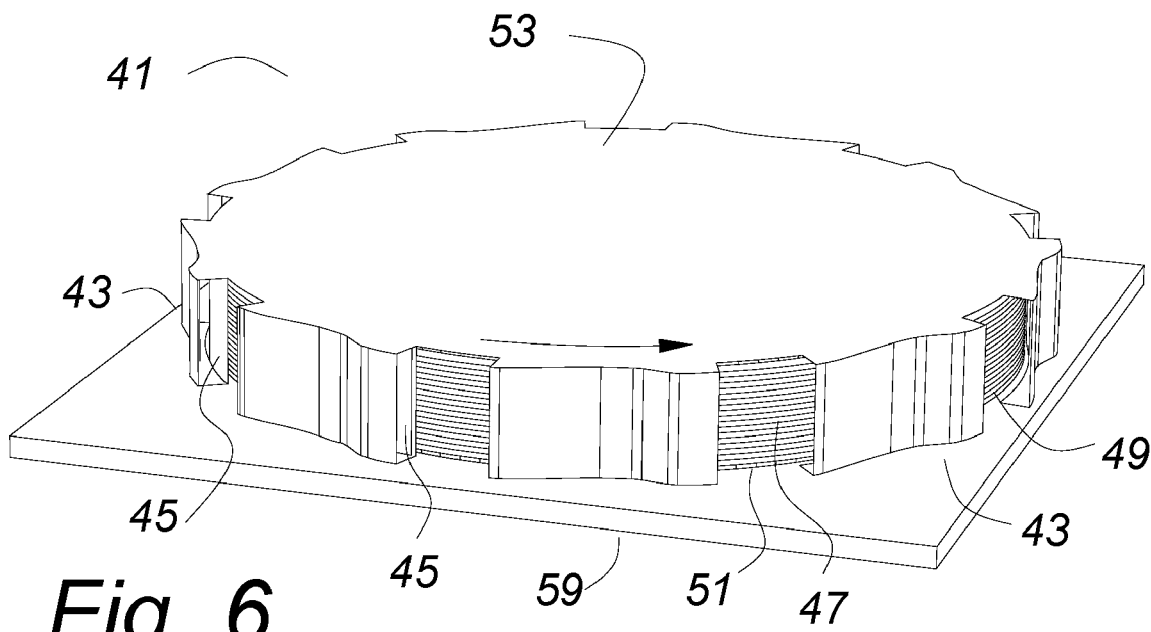
FIG. 6 shows another view of the venturi fan of FIG. 5.

In FIGS. 4 through 6, a fan and heat sink 41 comprises a venturi fan 53 rotating around a cylindrical heat sink 49. The venturi fan 53 comprises a plurality of venturis 43–43 having a half venturi profile as its outer periphery. The cylindrical heat sink 49 comprises an active heat dissipating surface comprising a plurality of heat sink fins 47 in good thermal contact with a metal cylinder 51 which, in turn, is in good thermal contact with a base plate 59 that is a cold plate.

Whereas in FIG. 3 the air is moved into the venturi 21, in the venturi fan 53 a plurality of venturis 43–43 are moved into the air as the fan 53 rotates as indicated by the arrow. As the fan 53 rotates, air is moved into the venturis 43–43, but as they are restrictions, there is a pressure increase ahead of the venturis 43–43. By Boyle's law, the temperature will increase, and it is desirable to keep the heated air out of the heat sink 49 to the extent possible. Accordingly, deflector pieces 45—45 block the air from the heat sink 49 ahead of each of the venturis 43—43.

As the air continues into the venturis 43—43, it is accelerated. Undisturbed (in the absence of the rotating venturis 43—43, the air within the heat sink 49 is static. However, as the fan 53 rotates counterclockwise as shown, the air will accelerate to have a clockwise movement under the venturis 43—43. This air is moving rapidly, with a reduced pressure and temperature, ideal conditions for removing heat from the heat sink 49. Not only does the air have a high velocity to scrub away the boundary layer, it also has a reduced temperature. As the venturis 43—43 move on, the air will decelerate, the pressure will recover and the temperature will rise. However, this will happen mostly in the space outside the heat sink 49.

As the plurality of venturis 43—43 move through the air around the heat sink 49, the air in the central portion of the venturi is forced into the space between the fins of the heat sink 49. Due to the decreased cross sectional area, the air is accelerated within the central portion of the venturi and the heat sink 49 is exposed to this air in this central portion of the venturi for improved heat removal from the heat sink 49. In FIG. 4, it may appear that this region has an increased area as compared to the throat of the venturi, but the fins of the heat sink 49 occupy a significant volume so the space remaining for air continues to be restricted within the heat sink 49. The air can expand decelerate and the pressure can recover only in the space behind the venturis.

In FIG. 6, it can be seen that the space between the venturis 43—43 is open. Due in part to the centrifugal forces due to the rotation of the fan 53 and in part to the agitation of the air by the venturis 43—43, the air is well mixed with ambient air and the exhaust heat is well dissipated.

Figure 7:
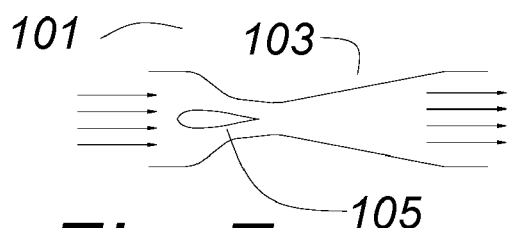
FIG. 7 shows a venturi with a center piece.

FIG. 7 shows a venturi 101 having a venturi wall 103 and a center piece 105. Center pieces are fairly common in venturis, often as the location point for a pressure sensor or for introducing a fluid into the air stream. It also serves to further restrict the air flow and thus further accelerate the airflow within the venturi.

Figure 8:
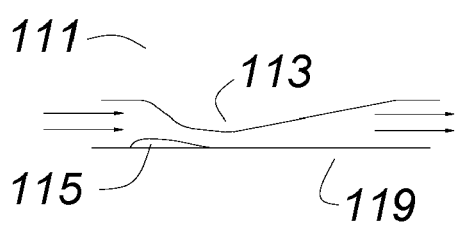
FIG. 8 shows a half venturi with a half center piece.

FIG. 8 shows a half venturi 111 having a venturi wall 113 and a dividing wall 119 as well as half a center piece 115.

Figure 9:
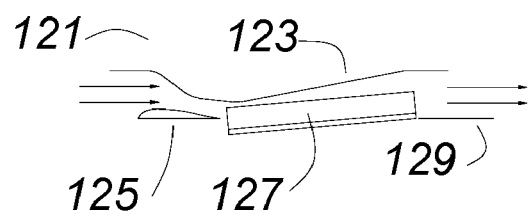
FIG. 9 shows a half venturi with a half center piece and with a heat sink.

FIG. 9 shows the introduction of a heat sink 127 into a half venturi 121 having a venturi wall 113 and a partial dividing wall 129. The half of a center piece 115 of FIG. 8 carries forward as a leading edge air foil 125. The part of the heat sink 127 that is outside of the venturi 121 on the leading edge is sealed to prevent ambient air from being sucked in. Operation is similar to that of the venturi 21 of FIG. 3.

Figure 10:
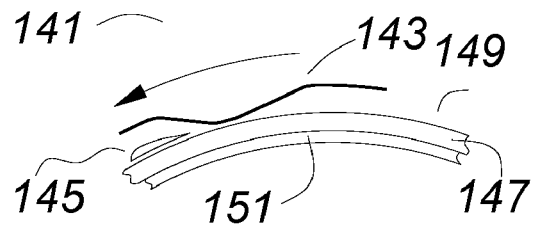
FIG. 10 shows a half venturi with a half center piece and with a cylindrical heat sink.
Figure 11:
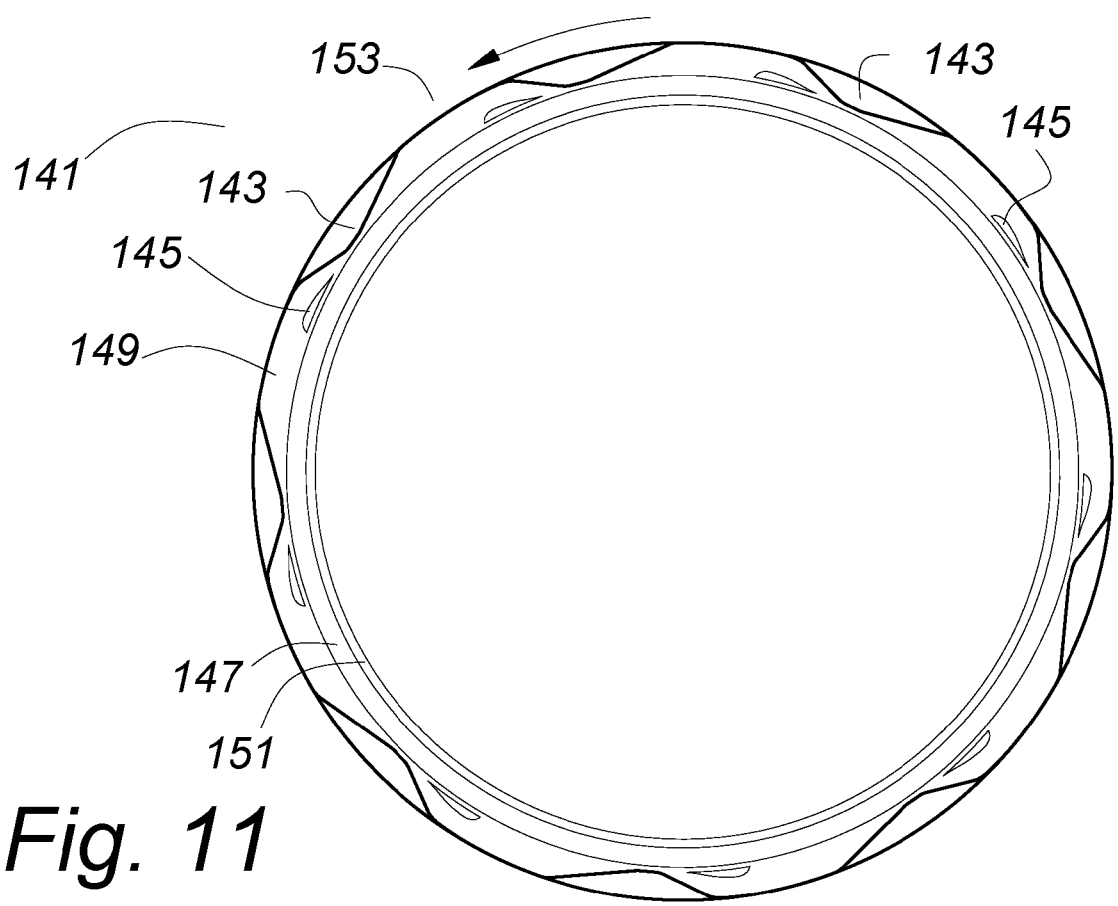
FIG. 11 shows a venturi fan rotating about a cylindrical heat sink.
Figure 12:
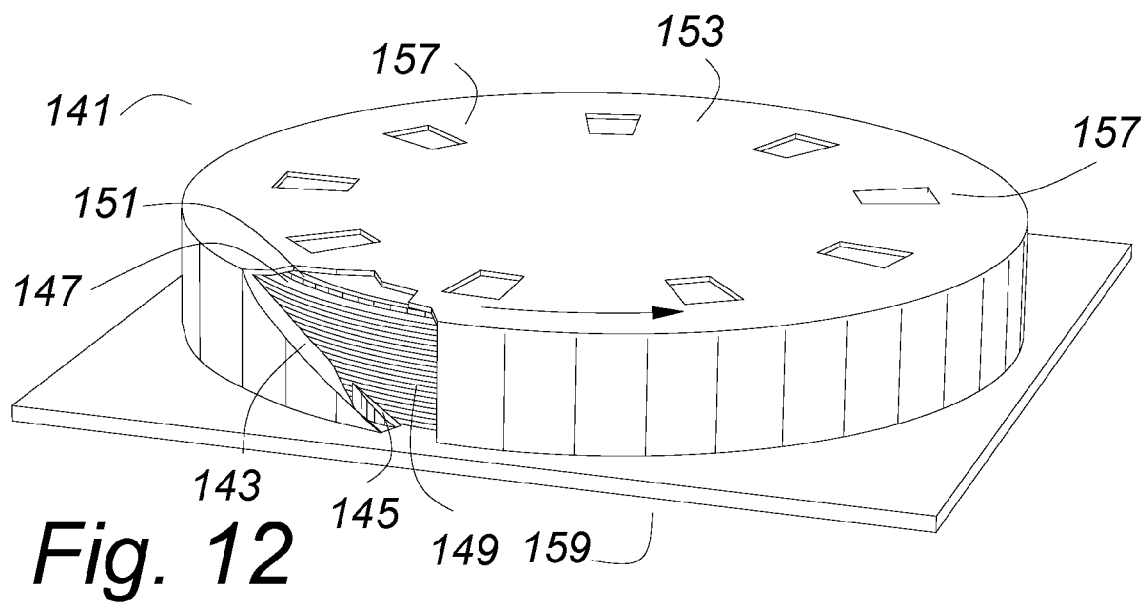
FIG. 12 shows another view of the venturi fan of figure 11.

FIGS. 10 through 12 show a fan and heat sink 141 comprising a venturi fan 153 rotating around a cylindrical heat sink 149. The heat sink 149 comprises a plurality of heat sink fins 147 in good thermal contact with a metal cylinder 151 which, in turn, is in good thermal contact with a base plate 159 that is a cold plate.

The principle of operation of the fan and heat sink 141 is similar to the operation of the fan and heat sink 41 of FIGS. 4 through 6 with the following differences. The leading edge deflectors 145—145 are airfoils, and the periphery of the fan 153 is a smooth closed surface except for plurality of vents 157—157. The deflector plates 145—145 have a thicker section, for more strength, and the thicker sections are shaped as airfoils to reduce drag. They still serve the function of deflecting the compressed air ahead of the venturis 143—143 from the heat sink 149.

Because the periphery of the fan 153 is closed, air is admitted into the fan 153 through a plurality of vents 137–157. The air will flow generally radially due to centrifugal force, and generally flow to the bottom of the fan and exit between the venturis 143—143, carrying away the heated air in the process. This air path and the centrifugal force of the rotating fan 153 will prevent any debris or contamination in the air from getting into the heat sink 149.

Because the outer surface of the fan 153 is smooth, it is not a hazard to intruding fingers and the like, so the fan and heat sink 141 may be operated without guards or enclosures.

Figure 13:
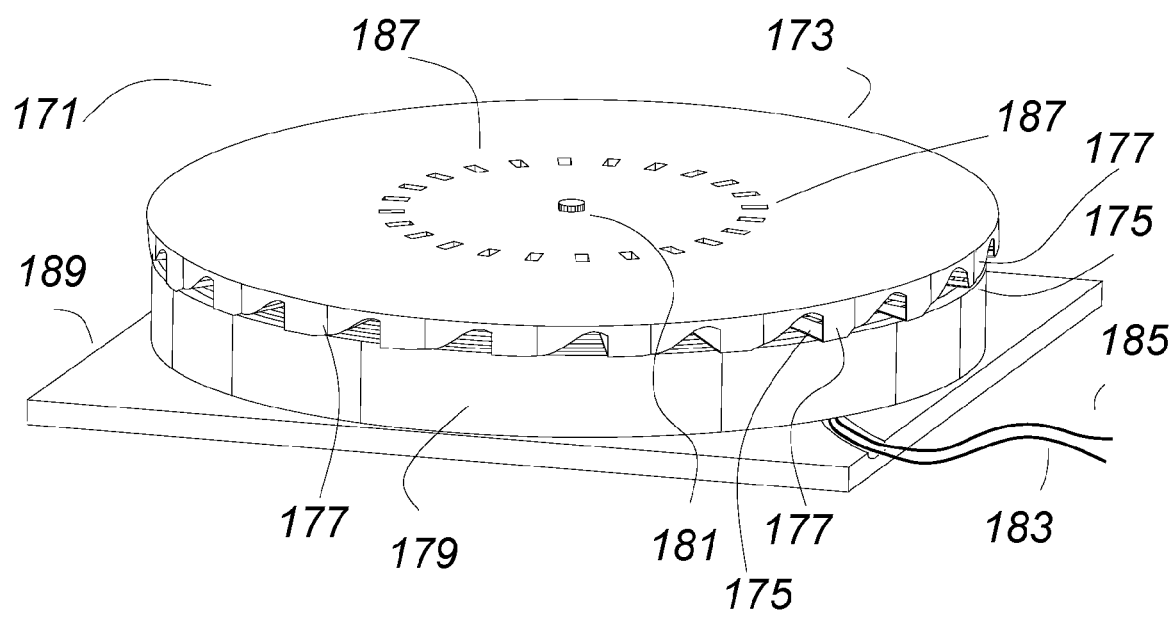
FIG. 13 shows a flat venturi fan rotating above a flat heat sink.

FIG. 13 shows a flat venturi fan with heat sink 171 comprising a flat venturi fan 173 and a flat heat sink 179. The venturi fan 173 and the heat sink 179 are not "flat" in the sense that a sheet of paper is flat, but rather the term "generally flat" is used to express that the lowest points of the flat venturi fan 173 lie in a plane, and the highest points of the flat heat sink 179 also lie in a plane, and the planes are closely proximate.

The venturi fan 173 may be rotated by a motor shaft 181 that in turn is rotated by a motor means (hidden). Usually the motor means is located in the center of the heat sink 179, but it could be separate, acting through a shaft and gears, pulleys couplings and so forth. In FIG. 13, the motor means may be powered by electrical wires 183 and 183. The heat sink 177 may further comprise a base plate 189 that may be a cold plate.

On the lower surface of the venturi fan 173, in a radial pattern entirely around the venturi fan 173 there are a plurality of half venturis 177—177, each of which further comprises a deflector plate 175—175. Operation is just as described above.

I claim:

1. A venturi-fan and heat sink comprising
   a venturi-fan,
   a heat sinking means,
   and a motor means for rotating the venturi fan relative to the heat sinking means,
   the heat sinking means having an active heat dissipating surface proximate to the venturi-fan, and
   the venturi-fan comprising a plurality of venturis that rotate around the heat sinking means proximate to the active heat dissipating surface of the heat sinking means,
   wherein the plurality of venturis of the venturi-fan are enclosed.

2. A venturi-fan and heat sink comprising
   a venturi-fan,
   a heat sinking means,
   and a motor means for rotating the venturi fan relative to the heat sinking means,
   the heat sinking means having an active heat dissipating surface proximate to the venturi-fan, and
   the venturi-fan comprising a plurality of venturis that rotate around the heat sinking means proximate to the active heat dissipating surface of the heat sinking means,
   the venturi-fan further comprising a plurality of deflector plates, one of the plurality of deflector plates being located at the leading edge of each of the plurality of venturis to deflect compressed air ahead of the venturis from the heat sinking means, so that
   the active heat dissipating surface of the heat sinking means is exposed to air in a central portion of the venturi where the air is accelerated to remove heat from the heat sinking means.

3. The venturi-fan and heat sink of claim 1 wherein the venturi-fan and the heat sinking means are cylindrical.

4. The venturi-fan and heat sink of claim 1 wherein the venturi-fan and the heat sinking means are flat.

5. The venturi-fan and heat sink of claim 1 further comprising a plurality of deflector plates, one of the plurality of deflector plates being located at the leading edge of each of the plurality of verituris to deflect compressed air ahead of the venturis from the heat sinking means.

6. The venturi-fan and heat sink of claim 2 wherein the venturi-fan and the heat sinking means are cylindrical.

7. The venturi-fan and heat sink of claim 2 wherein the venturi-fan and the heat sinking means are flat.

8. The venturi-fan and heat sink of claim 2 wherein the plurality of venturis of the venturi-fan are open.

9. The venturi-fan and heat sink of claim 2 wherein the plurality of venturis of the venturi-fan are enclosed.

* * * * *